(12) United States Patent
Davie

(10) Patent No.: US 6,876,842 B2
(45) Date of Patent: Apr. 5, 2005

(54) SUPERHETERODYNE RECEIVERS

(75) Inventor: Alan J. Davie, East Grinstead (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 444 days.

(21) Appl. No.: 10/213,424

(22) Filed: Aug. 6, 2002

(65) Prior Publication Data

US 2003/0050035 A1 Mar. 13, 2003

(30) Foreign Application Priority Data

Sep. 12, 2001 (GB) .............................................. 0121993

(51) Int. Cl.[7] .................................................. H04B 1/10
(52) U.S. Cl. ....................... 455/302; 455/315; 455/314; 455/285
(58) Field of Search ................................. 455/315, 302, 455/285, 283, 296, 314, 339, 340, 209, 207; 375/316, 150

(56) References Cited

U.S. PATENT DOCUMENTS

| | | | | |
|---|---|---|---|---|
| 3,619,788 A | * | 11/1971 | Giles et al. .............. | 455/166.2 |
| 4,112,375 A | * | 9/1978 | Schittko et al. .......... | 455/196.1 |
| 4,225,974 A | * | 9/1980 | Miyamoto .................. | 455/207 |
| 5,606,736 A | * | 2/1997 | Hasler et al. .............. | 455/314 |
| 5,758,276 A | * | 5/1998 | Shirakawa et al. ......... | 455/314 |
| 5,832,375 A | * | 11/1998 | Leisten et al. .............. | 455/314 |
| 6,781,424 B2 | * | 8/2004 | Lee et al. .................... | 327/113 |
| 2003/0032398 A1 | * | 2/2003 | Harris ........................ | 455/147 |
| 2004/0198288 A1 | * | 10/2004 | Sadowski .................... | 455/259 |

FOREIGN PATENT DOCUMENTS

WO    WO9601006    6/1995    ............ H03D/7/16

* cited by examiner

*Primary Examiner*—Sonny Trinh

(57) ABSTRACT

A superhet receiver in which an input signal is frequency down-converted in a first mixer (14) to produce a first IF signal comprising a wanted channel signal and an image channel signal. The first IF signal, without image rejection filtering, is frequency down-converted in a second mixer (24) to produce a second, lower IF signal comprising at least the wanted channel signal having a bandwidth corresponding to a predetermined passband of a channel filter (32) coupled to the output of the second mixer. The local oscillator signals used in the first and second frequency down conversion processes are varied in order to produce successively different image channel signals in the first IF signal and to maintain the wanted channel signal in the second IF signal within the passband of the channel filter (32). By rapidly hopping the local oscillator signals in the frequency domain the wanted signal can be made to remain stationary within the bandwidth of the channel filter whilst other unwanted frequencies are spread across a wider bandwidth and have their amplitudes averaged in the filter (32).

9 Claims, 3 Drawing Sheets

SUPERHETERODYNE RECEIVERS

Figure 1:
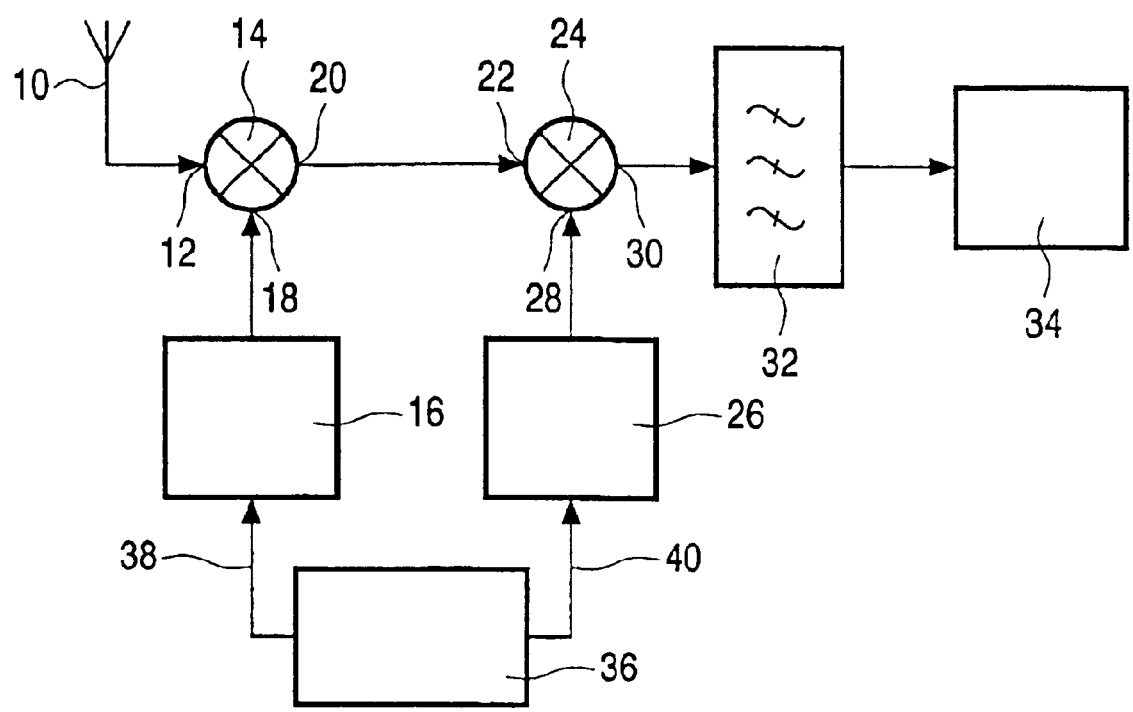

The present invention relates to improvements in or relating to superheterodyne receivers and to a method of image rejection filtering.

In traditional superheterodyne (generally referred to as superhet) receivers it is generally impractical to mix an incoming narrow band, RF signal directly down to a low IF. This is usually because of the impossibly high Q requirements that would be imposed on the front-end image rejection filters. In order to help circumvent this problem a second stage of mixing is often introduced creating a second, lower IF. The main problem with this type of receiver is that it requires the use of two separate image rejection filters, one before each mixer. Also, since the selectivity required from each filter is usually quite high, in practice they tend to be realised as discrete off-chip designs. This makes a double conversion receiver inherently difficult to integrate fully and therefore relatively expensive to produce.

It is an object of the present invention to provide an effective integratable double conversion receiver.

According to one aspect of the present invention there is provided a superhet receiver comprising a first mixer having a first input for an input signal, a second input for a first local oscillator signal and an output for a first frequency converted signal, a first source of local oscillator signals coupled to the second input of the first mixer, a second mixer having a first input coupled to the output of the first mixer, a second input for a second local oscillator signal and an output for a second frequency converted signal, a second source of local oscillator signals coupled to the second input of the second mixer, a bandpass filter having a predetermined passband coupled to the output of the second mixer, means for varying the first source of local oscillator signals to produce a first frequency converted signal including a wanted channel signal and successively different image channel signals, and means for varying the second source of local oscillator signals such that the spectrum of the wanted channel signal in the second frequency converted signal lies within the passband of the bandpass filter.

According to a second aspect of the present invention there is provided a method of image rejection filtering, comprising subjecting an input signal to a frequency down conversion process to produce a first IF signal comprising a wanted channel signal and an image channel signal, subjecting the first IF signal to a second frequency down conversion process to produce a second IF signal comprising at least the wanted channel signal having a bandwidth corresponding to a predetermined passband of channel filtering means, wherein local oscillator signals used in the first and second frequency down conversion processes are varied in order to produce successively different image channel signals in the first IF signal and to maintain the wanted channel signal in the second IF signal within the passband of the channel filtering means.

By varying the first local oscillator frequency to get successively different image channel signals or interferers with the wanted signal and adjusting the second local oscillator frequency to keep the wanted signal plus the current interferer within the passband of the low frequency bandpass filter not only can the filter be integrated with other components of the receiver but also the amplitudes of unwanted image signals are smeared across a wide bandwidth and are averaged by the channel filter. The continuous changing of unwanted image signals means that each unwanted signal is present only briefly. Hence with a large amplitude image signal its contribution to the average is diminished. Additionally processing gain can be obtained in the event of some of the image channels being vacant or containing only low amplitude signals. Another benefit is that it is no longer necessary to have image rejection filters prior to the first and second mixers.

Conveniently the first and second local oscillators are varied in accordance with respective random frequency hopping sequences. The variation of the frequency hopping sequences may be related and be moved randomly in equal but opposite directions so that wanted signal in the second IF signal remains within the bandwidth of the bandpass filter whilst the current image or interfering signal changes.

Figure 2:
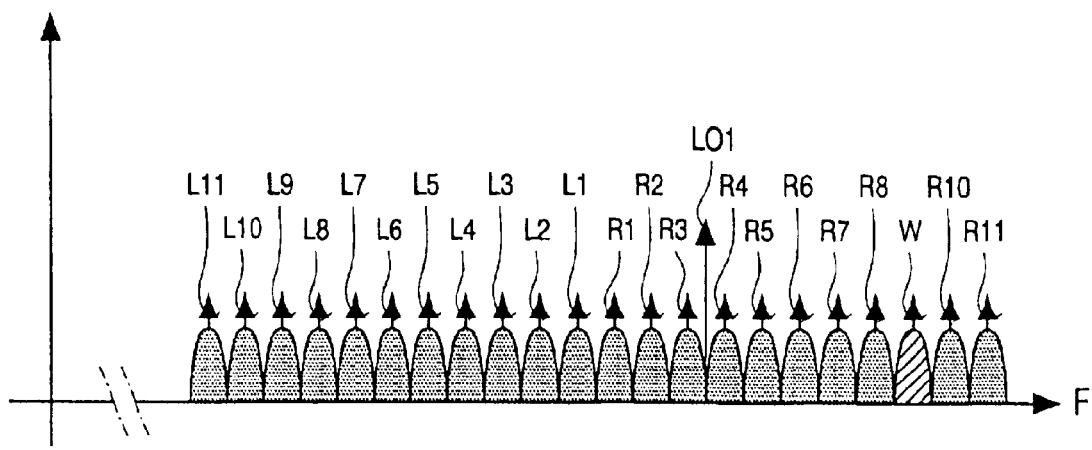
Figure 3:
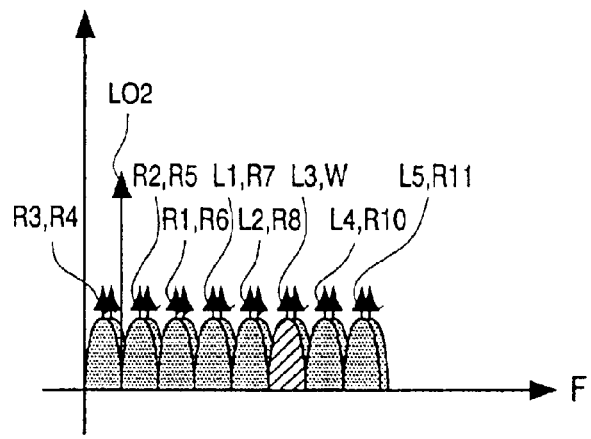
Figure 4:
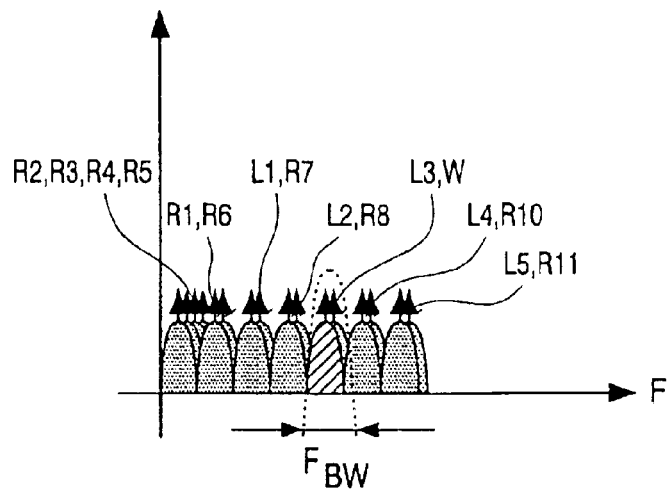
Figure 5:
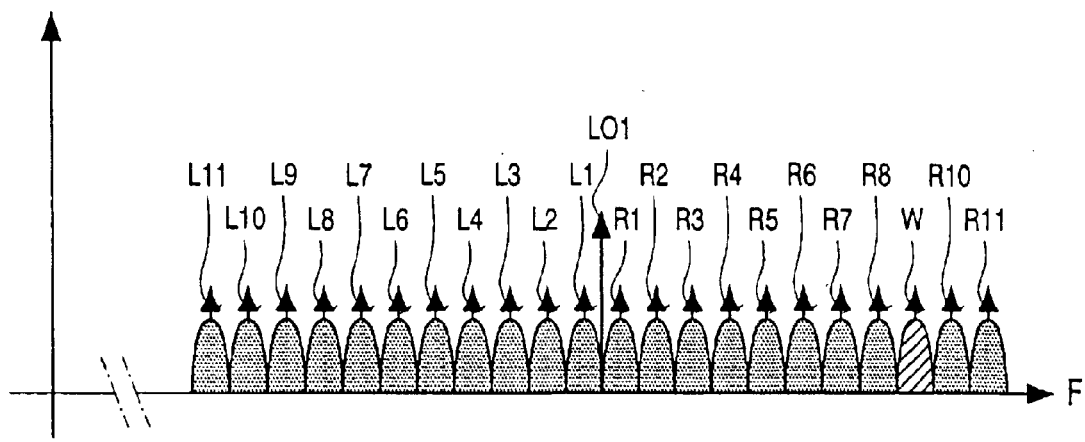
Figure 6:
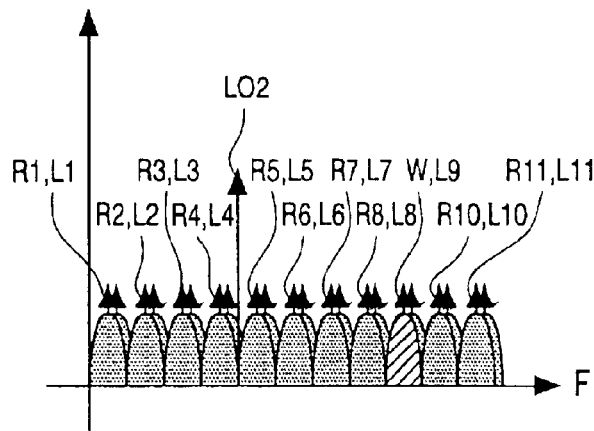
Figure 7:
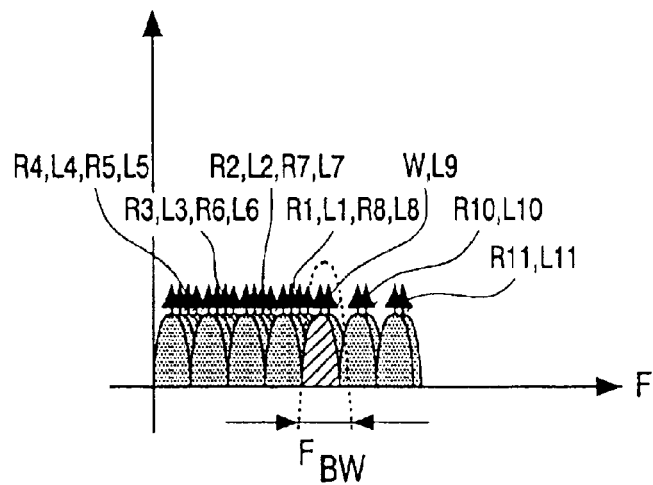

The present invention will now be described, by way of example, with reference to the accompanying drawings, wherein:

FIG. 1 is a block schematic diagram of a double conversion superhet receiver made in accordance with the present invention, FIG. 2 represents the channel frequencies and a first local oscillator frequency on the respective inputs of a first mixer of the receiver shown in FIG. 1, FIG. 3 represents the frequency converted channel frequencies and a second local oscillator frequency on the respective inputs of a second mixer of the receiver shown in FIG. 1, FIG. 4 represents the frequency converted channel frequencies at the output of the second mixer, FIG. 5 represents the channel frequencies and a different first local oscillator frequency to that shown in FIG. 2 on the respective inputs of a first mixer of the receiver shown in FIG. 1, FIG. 6 represents the frequency converted channel frequencies and a different second local oscillator frequency to that shown in FIG. 3 on the respective inputs of a second mixer of the receiver shown in FIG. 1, and FIG. 7 represents the frequency converted channel frequencies at the output of the second mixer.

In the drawings the same reference numerals have been used to represent corresponding features.

The double conversion superhet receiver shown in FIG. 1 comprises an antenna 10 coupled to a first input 12 of a first mixer 14. A source 16 of first local oscillator signals LO1, such as a frequency synthesizer, is coupled to a second input 18 of the mixer 14. An output 20 of the first mixer 14 comprising a first IF signal is coupled to a first input 22 of a second mixer 24. A source 26 of second local oscillator signals LO2, such as a frequency synthesizer, is coupled to a second input 28 of the mixer 24. An output 30 of the second mixer 24 comprising a second IF signal is coupled to a channel filter comprising a bandpass filter 32, the bandwidth $F_{BW}$ of which is such as to pass the signals present in the wanted signal channel. A demodulator 34 is coupled to an output of the filter 32.

The first and second local oscillator signals LO1 and LO2 are varied, for example frequency hopped, as will be described with reference to FIGS. 2 to 7. A hopping sequence function generator 36 has outputs 38, 40 coupled respectively to the sources 16, 26 for controlling the selection of frequencies comprising the first and second local oscillator signals LO1 and LO2.

The principle of operation of the illustrated double conversion superhet receiver is to use spread spectrum techniques, employed inside the receiver, to help resolve the wanted signal from its image. This is effected by frequency hopping the local oscillators in a suitable manner so that the wanted signals are preserved as narrowband signals whilst unwanted images which in practice are of variable amplitudes are spectrally spread in the amplitude averaging carried out in the bandpass filtering thereby reducing their effect on the wanted signal. The key steps to explain the concept will be described below with reference to FIGS. 2 to 4 and FIGS. 5 to 7.

Referring initially to FIGS. 2 to 4, FIG. 2 shows a plurality of contiguous frequency channels L1 to L11, R1 to R8, W, R10 and R11, where channel W, shown cross-hatched, represents the wanted channel. Although for convenience the amplitudes of the channel signals have been shown to be equal, in reality the amplitudes will vary and also there will be occasions when one or more of the channels will have no signal. Thus signals received at the antenna 10 could be present in some or all of these frequency channels and be present on the first input 12 of the first mixer. A local oscillator signal LO1 having a frequency between the channels R3, R4 is applied to the second input 18 of the first mixer. The channel frequencies are frequency down-converted and the first IF signal on the output 20 of the first mixer 14 is as shown in FIG. 3.

The frequency spectrum has been folded about the first local oscillator frequency LO1 and as a result an unwanted interferer having an image frequency L3 is also mixed down to a frequency coincident with that of the wanted channel W. As indicated above the amplitudes of the wanted signal W and the unwanted interferer are likely to be different. The first IF signal, without image rejection RF filtering, is present on the first input 22 of the second mixer. A second local oscillator signal LO2 having a frequency lower than that of the signal LO1, is applied to the second input 28 of the second mixer 24. The choice of frequency for the signal LO2 is determined such that the wanted channel and the unwanted interferer, in this instance the image frequency L3, lie within the bandwidth $F_{BW}$ of the filter shown in dotted lines in FIG. 4. The second IF signal is as shown in FIG. 4. The spectrum has been folded about the frequency of the second local oscillator signal LO2. The wanted channel signal W and the interfering image signal L3 are still coincident in frequency and therefore unresolvable. However the bandpass filter 32 (FIG. 1) is a low frequency filter which effectively averages the wanted and unwanted signals. As the filter 32 is a low frequency filter it can be fully integrated with other parts of the receiver.

FIGS. 5 to 7 effectively correspond to FIGS. 2 to 4 with the difference that the first and second local oscillator signals LO1 and LO2 have been changed as a result of frequency hopping. In FIG. 5 the signal LO1 has been decreased in frequency by the equivalent of three channel spacings and now lies between channels L1 and R1. The first IF signal shown in FIG. 6 now shows the wanted channel signal W having a higher frequency than in FIG. 3 and being coincident with an interfering channel L9 which corresponds to a new image frequency.

In order to keep the wanted signal W within the passband response $F_{BW}$ of the channel filter 32 after the second stage of mixing, the frequency of the local oscillator signal LO2 has to be increased in frequency by also three channel spacings. The results of this operation can be seen in FIG. 7 where the wanted channel W and the interferer L9 have been isolated by $F_{BW}$. By comparing FIGS. 4 and 7 it can be seen that although the wanted signal W effectively remains stationary within the passband $F_{BW}$ of the channel filter 32, the coincident interferer changes from being L3 in the first case to L9 in the second case. The frequencies of the first and second local oscillator signals LO1 and LO2 can be varied, for example hopped, according to any suitable sequence. Such a sequence, for example, may be generated by a frequency hopping sequence generator or may be a pre-stored pseudo-random sequence. For example, looking at FIG. 2 or 5, if the signal LO1 is changed by the equivalent of one channel, the next but one unwanted channel coincides with the wanted signal W. The averaging process in the bandpass filter 32 will tend to reduce the mean average of the interferers whilst leaving the wanted signal W substantially unaffected. By frequently varying the frequencies of the first and second local oscillator signals, each unwanted signal is present only briefly. Hence the contribution of a large interferer to the average is diminished.

If the frequencies of the signals LO1 and LO2 are moved randomly in equal but opposite directions then, the wanted signal will remain stationary while other unwanted frequencies will be smeared across a wider bandwidth.

The rate at which the frequencies of the first and second local oscillator signals are varied may be chosen to give a desired averaging period. For example the rate may be rapid as used typically for frequency hopped spread spectrum systems (FHSS).

If all the adjacent channels have large signals in them (equivalent to having lots of simultaneous users in a normal FHSS system) then the processing gain diminishes to zero. However, if some channels are vacant or only have low amplitude signals in them then the processing gain will increase.

Optionally the rate at which the frequencies of the first and second local oscillator signals are varied may itself be varied, to reduce the time spent on frequencies where large interfering image signals are present.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of superhet receivers and component parts therefor and which may be used instead of or in addition to features already described herein.

What is claimed is:

1. A superhet receiver comprising a first mixer having a first input for an input signal, a second input for a first local oscillator signal and an output for a first frequency converted signal, a first source of local oscillator signals coupled to the second input of the first mixer, a second mixer having a first input coupled to the output of the first mixer, a second input for a second local oscillator signal and an output for a second frequency converted signal, a second source of local oscillator signals coupled to the second input of the second mixer, a bandpass filter having a predetermined passband coupled to the output of the second mixer, means for varying the first source of local oscillator signals to produce a first frequency converted signal including a wanted channel signal and successively different image channel signals, and means for varying the second source of local oscillator signals such that the spectrum of the wanted channel signal in the second frequency converted signal lies within the passband of the bandpass filter.

2. A superhet receiver as claimed in claim 1, characterised in that the means for varying the frequencies of the first and second sources of local oscillator signals comprises a frequency hopping sequence generator.

3. A superhet receiver as claimed in claim 1, characterised in that the means for varying the frequencies of the first and second sources of local oscillator signals comprises means for randomly varying the frequencies in equal but opposite directions.

4. A superhet receiver as claimed in claim 1, characterised in the means for varying the frequencies of the first and second sources of local oscillator signals comprises means for varying the local oscillator frequencies in accordance with pre-stored pseudo-random sequences.

5. A module comprising the superhet receiver as claimed in claim 1.

6. A method of image rejection filtering, comprising subjecting an input signal to a frequency down conversion process to produce a first IF signal comprising a wanted channel signal and an image channel signal, subjecting the first IF signal to a second frequency down conversion process to produce a second IF signal comprising at least the wanted channel signal having a bandwidth corresponding to a predetermined passband of channel filtering means, wherein local oscillator signals used in the first and second frequency down conversion processes are varied in order to produce successively different image channel signals in the first IF signal and to maintain the wanted channel signal in the second IF signal within the passband of the channel filtering means.

7. A method as claimed in claim 6, characterised in that the local oscillator signals used in the first and second frequency down conversion processes are varied in accordance with respective frequency hopping sequences.

8. A method as claimed in claim 6, characterised in that the local oscillator signals used in the first and second frequency down conversion processes are varied in equal and opposite directions.

9. A method as claimed in claim 6, characterised in that the local oscillator signals used in the first and second frequency down conversion processes are varied in accordance with pre-stored pseudo-random sequences.

* * * * *